US007220604B2

(12) United States Patent
Satake et al.

(10) Patent No.: US 7,220,604 B2
(45) Date of Patent: May 22, 2007

(54) METHOD AND APPARATUS FOR REPAIRING SHAPE, AND METHOD FOR MANUFACTURING SEMICONDUCTOR DEVICE USING THOSE

(75) Inventors: Tohru Satake, Chigasaki (JP); Nobuharu Noji, Zushi (JP); Masahiro Hatakeyama, Fujisawa (JP); Kenji Watanabe, Hiratsuka (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/091,704

(22) Filed: Mar. 29, 2005

(65) Prior Publication Data

US 2005/0224457 A1 Oct. 13, 2005

(30) Foreign Application Priority Data

Mar. 30, 2004 (JP) ............................. 2004-099127

(51) Int. Cl.
*H01L 21/00* (2006.01)
*G01R 31/26* (2006.01)
(52) U.S. Cl. .................. 438/7; 438/4; 438/14; 438/16; 257/E21.53; 257/E21.525; 257/E21.521
(58) Field of Classification Search .................. 438/4, 438/443, 444, 5, 7, 14, 16, FOR. 100, FOR. 101, 438/FOR. 434; 250/310; 257/E21.521, 257/E21.525, E21.529, E21.53
See application file for complete search history.

(56) References Cited

U.S. PATENT DOCUMENTS

| | | | | |
|---|---|---|---|---|
| 3,876,879 A | * | 4/1975 | McAdams et al. .......... 250/307 |
| 4,108,751 A | * | 8/1978 | King ...................... 204/192.11 |
| 4,560,435 A | * | 12/1985 | Brown et al. ................. 216/40 |
| 4,906,326 A | * | 3/1990 | Amemiya et al. ............. 430/5 |
| 5,412,210 A | * | 5/1995 | Todokoro et al. ........... 250/310 |
| 5,677,011 A | * | 10/1997 | Hatakeyama et al. ....... 427/497 |
| 5,754,678 A | * | 5/1998 | Hawthorne et al. ......... 382/149 |
| 6,365,423 B1 | * | 4/2002 | Heinlein et al. .............. 438/14 |
| 6,645,781 B1 | * | 11/2003 | Jiang et al. .................... 438/14 |
| 6,670,602 B1 | * | 12/2003 | Kohama et al. ............ 250/235 |
| 6,723,572 B2 | * | 4/2004 | Yano et al. ................... 438/14 |
| 2003/0025904 A1 | * | 2/2003 | Sakai et al. ............. 356/237.2 |
| 2005/0202575 A1 | * | 9/2005 | Usui et al. ..................... 438/7 |

* cited by examiner

*Primary Examiner*—Matthew Smith
*Assistant Examiner*—Quovaunda Jefferson
(74) *Attorney, Agent, or Firm*—Westerman, Hattori, Daniels & Adrian, LLP.

(57) ABSTRACT

The invention relates to a method for enabling repair of a defect in a substrate, particularly the invention provides a method and apparatus for enabling repair of a pattern shape in a semiconductor device, which has not been able to be practiced because of lack of a suitable method, and further provides a method for manufacturing the semiconductor device using those. A method for repairing the pattern shape of a substrate having an imperfect pattern is used, which includes (a) a step for inspecting the substrate and thus detecting the imperfect pattern, and (b) a step for repairing the pattern shape by performing etching or deposition to the detected imperfect-pattern using radiation rays. Moreover, apparatus for repairing a pattern shape of a via-hole in a wafer having an imperfect via-hole is used, which has a defect inspection section for detecting the imperfect via-hole, and an etching section for etching the imperfect via-hole using a fast atom beam.

11 Claims, 7 Drawing Sheets

FIG. 3 RELATION BETWEEN IMAGE CONTRAST AND ETCHING TIME
(IN THE CASE OF PROJECTION-ELECTRON-MICROSCOPE-TYPE INSPECTION APPARATUS)

METHOD AND APPARATUS FOR REPAIRING SHAPE, AND METHOD FOR MANUFACTURING SEMICONDUCTOR DEVICE USING THOSE

BACKGROUND OF THE INVENTION

1. Field of the Invention

The present invention relates to a method and apparatus for repairing a pattern of a substrate, and a method for manufacturing a semiconductor device using those.

2. Description of the Related Art

In a manufacturing process of a semiconductor device, defects occurring during processing a substrate such as wafer sometimes become fatal defects (killer defects). As density of the device becomes higher, the defects become the killer defects in more cases even if they are microscopic defects. Such defects cause reduction in yield in the semiconductor manufacturing process. In particular, when the defects occur in front-end of the manufacturing process, influence on the yield is more significant. At present, the defects are not repaired in an individual step, and a method is used, wherein a redundant circuit is previously formed, and a defective circuit is broken (open) using laser so that it is not used. That is, repairing the defect occurring in each step, for example, repairing open or short circuit of wiring or removing a residue in a via-hole has not been performed.

However, the density of the device becomes higher, for example, a wafer having a high density pattern having the minimum line width of 0.1 µm or less has appeared, therefore the redundant circuit is impossible to be formed. In a logic device, the production of which has increased in recent years, greater need is given for improving the yield by repairing the defects because the production is small.

Inspection apparatus using an electron beam (EB) (U.S. Pat. No. 6,184,526, U.S. Pat. No. 5,502,306 and J. Vac. Sci. Technol. B9(6) (1991) 3005), or a processing machine using a fast atom beam (FAB) (JP-A-5-182787 and JP-A-7-169746) is known. However, repairing a shape of an imperfect pattern, for example, etching of the residue has not been performed.

SUMMARY OF THE INVENTION

The invention relates to a method that enables the repair of the defects in the wafer, particularly in a semiconductor device, it provides a method and apparatus that enable removal of the etching residue in the via-hole, which has not been able to be practiced because of lack of a suitable method, and further provides a method for manufacturing the semiconductor device using those.

The invention is a method for repairing a pattern shape of a substrate having the imperfect pattern, including (a) a step for inspecting the substrate and detecting the imperfect pattern, and (b) a step for repairing the pattern shape by performing etching or deposition to the detected imperfect-pattern using radiation rays.

According to the invention, the shape of the imperfect via-hole is repaired, thereby the yield of the semiconductor device can be improved.

The invention is the shape repairing method, further including at least one (c) step for inspecting the substrate again and thus confirming absence of the imperfect pattern.

According to the invention, since the substrate is inspected again after the etching, the yield of the semiconductor device can be further improved.

Moreover, the invention is the shape repairing method, wherein the etching or the deposition is performed by irradiating the radiation rays simultaneously on an entire surface of the substrate.

According to the invention, since the radiation rays are irradiated simultaneously on the entire surface of the substrate, the imperfect pattern shape can be repaired in a short period of time.

Furthermore, the invention is the shape repairing method, wherein the inspection is inspection in which the electron beam is used.

Moreover, the invention is the shape repairing method, wherein the inspection using the electron beam is inspection in which projection-electron-microscope-type electron-beam apparatus or scanning-type electron-beam apparatus is used.

According to the inventions, since the substrate is inspected using the electron beam, the substrate having the high-density pattern can be inspected.

Furthermore, the invention is the shape repairing method, wherein irradiation time of the radiation rays is changed according to image contrast of the imperfect pattern obtained in the inspection.

According to the invention, the irradiation time of the radiation rays can be changed according to the obtained image contrast, thereby the imperfect pattern shape can be repaired in the short period of time.

Moreover, the invention is the shape repairing method, wherein only a previously-set-region where the imperfect pattern is easy to occur is inspected in the inspection.

According to the inventions, since only the region where the imperfect pattern is easy to occur, for example, a cell portion at an end of a die at an end of the wafer is inspected, inspection time can be shortened.

Moreover, the invention is the shape repairing method, wherein the pattern is metal wiring, a via-hole, or a via-plug.

Moreover, the invention is the shape repairing method, wherein the substrate is the wafer.

According to the inventions, the shape of the metal wiring, via-hole, or via-plug, which is formed on the wafer, can be repaired.

Moreover, the invention is the shape repairing method, wherein the radiation rays are the fast atom beam.

According to the inventions, the pattern shape can be repaired in the short period of time using the fast atom beam.

Furthermore, the invention is apparatus for repairing the pattern shape of the substrate having the imperfect pattern, which comprises a defect inspection section for detecting the imperfect pattern, and a radiation-ray irradiation section for performing etching or deposition to the imperfect pattern using the radiation rays.

Moreover, the invention is the shape repairing apparatus, wherein the defect inspection section has defect inspection apparatus of the projection-electron-microscope-type or the scanning-type (SEM-type) using the electron beam.

Furthermore, the invention is the shape repairing apparatus, wherein the irradiation time of the radiation rays is changed according to the image contrast of the imperfect pattern obtained by the defect inspection section.

Moreover, the invention is the shape repairing apparatus, wherein the defect inspection section inspects only the previously-set-region where the imperfect pattern is easy to occur.

Furthermore, the invention is the shape repairing apparatus, wherein the pattern is the metal wiring, via-hole, or via-plug.

Furthermore, the invention is the shape repairing apparatus, wherein the substrate is the wafer.

Furthermore, the invention is the shape repairing apparatus, wherein the radiation rays are the fast atom beam.

According to these inventions, the same advantages as in the shape repairing method can be obtained.

Furthermore, the invention is a method for manufacturing the semiconductor device including a step for repairing the pattern shape using the shape repairing method or the shape repairing apparatus.

According to the invention, since the pattern shape of the substrate having the imperfect pattern can be repaired, the yield of the semiconductor device can be improved.

Moreover, the invention is the manufacturing method, wherein tact time in manufacturing the semiconductor device including the step for repairing the pattern shape is the same as tact time in the case without including the step.

According to the invention, the pattern shape of the substrate having the imperfect pattern can be repaired without lengthening the manufacturing time of the semiconductor device.

According to the shape repairing method and the shape repairing apparatus, the substrate pattern can be repaired in front-end of a manufacturing process of the semiconductor device, for which there has not been any practicable measure, thereby yield in the front-end of the semiconductor process can be remarkably improved. Moreover, an excellent advantage of drastic decrease in cost is obtained by applying those to the method for manufacturing the device.

DETAILED DESCRIPTION OF THE INVENTION

Figure 1:
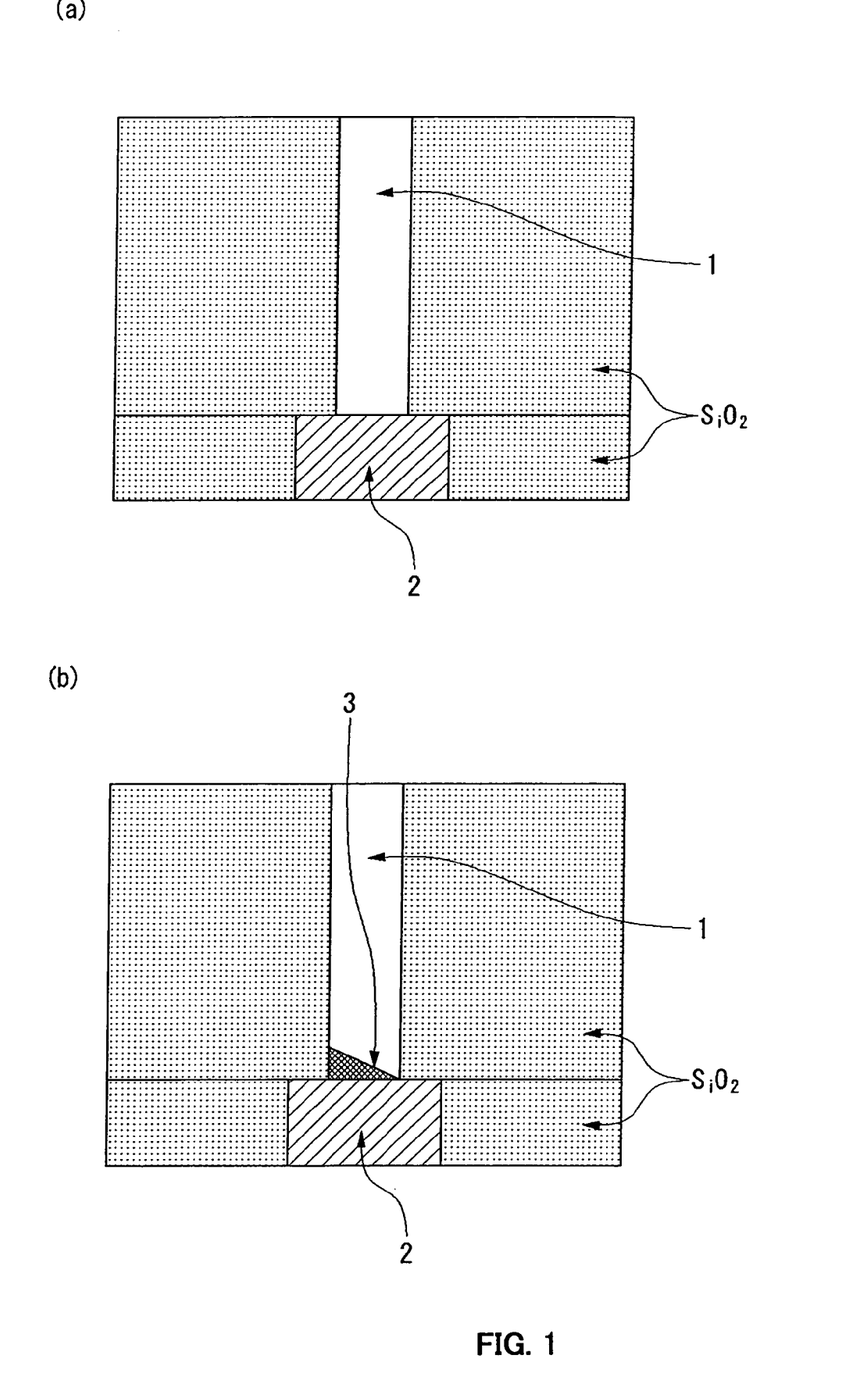
FIG. 1 is a schematic view showing a condition that the via hole is opened in a wiring step in the semiconductor manufacturing process.

Hereinafter, an embodiment of the invention is described using a case, as an example, that the wafer is used as the substrate, the via-hole as the pattern, and the fast atom beam (FAB) as the radiation rays, and the residue in the via-hole is etched. FIG. 1 is a schematic view showing a condition that the via-hole is opened in a wiring step in a semiconductor manufacturing process. That is, FIG. 1 shows a condition that metal wiring 2 is formed, and then $SiO_2$ is deposited using CVD (Chemical Vapor Deposition) and etched, and then a via-hole 1 is opened. FIG. 1A shows a case that the via-hole is normally opened, and FIG. 1B shows a case that the via-hole is imperfect. In FIG. 1B, a residue 3 (etching residue) is remained at a bottom of the via-hole, and when metal is filled in the via-hole using wet plating or CVD method later in that condition, the metal insufficiently contacts to an underneath metal-wiring 2, resulting in loss of functions as an element. That is, the defects (killer defects) are generated.

After the via-hole is opened, when the bottom of the via-hole is inspected using the inspection apparatus using the electron beam, contrast is different between the imperfect via-hole having the residue and the normal via-hole, accordingly the two can be distinguished from each other. In the case of the SEM (Scanning Electron Microscope) type inspection apparatus, which is a conventional type, the normal via-hole is dark, and the imperfect via-hole is bright. On the other hand, in the case of the projection-electron-microscope-type inspection apparatus, which has been recently developed, the normal via-hole is bright, and the imperfect via-hole is dark. From the difference in brightness, presence of the imperfect via-hole can be examined.

Figure 2:
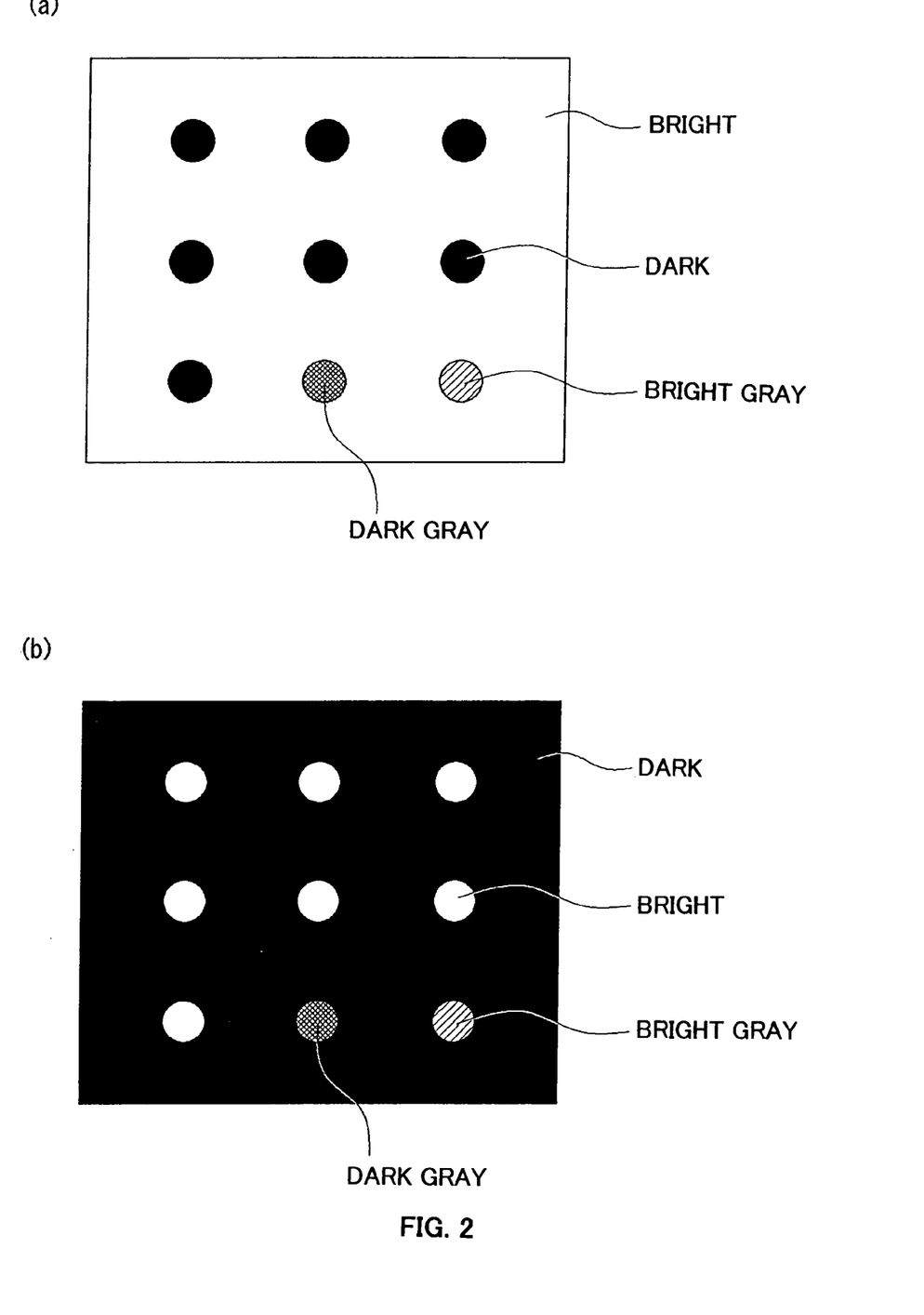
FIG. 2A is a view showing a schematic example of an inspection image obtained by the SEM-type inspection apparatus.
FIG. 2B is a view showing a schematic example of an inspection image obtained by the projection-electron-microscope-type inspection apparatus.

FIG. 2 schematically shows inspection images in respective cases. FIG. 2A is a schematic example of an inspection image obtained by the SEM-type inspection apparatus, and FIG. 2B is a schematic example of an inspection image obtained by the projection-electron-microscope-type inspection apparatus. As shown in the figures, the imperfect via-hole shows different contrast from that in the normal via-hole. That is, when larger amount of residue is left, the inspection image is brighter in the SEM-type inspection apparatus, and darker in the projection-electron-microscope-type inspection apparatus. For example, FIG. 2A shows that a via-hole indicated as "dark" is normally etched, a via-hole indicated as "dark grey" or "bright grey" is the imperfect via-hole having the residue, and shows that the "bight grey" has larger amount of residue than the "dark grey". On the other hand, FIG. 2B shows that while a via-hole indicated as "bright" is normally etched, the via-hole indicated as "bright grey" or "dark grey" is the imperfect via-hole having the residue, and shows that the "dark grey" has larger amount of residue than the "bright grey".

When the imperfect via-hole is detected in the pattern of the wafer in the inspection, then FAB (Fast Atom Beam) is irradiated onto the wafer to etch and to remove the residue. Generally, since the amount of residue is extremely slight, etching time using the FAB can be made short. When the basic material is $SiO_2$ as in FIG. 1, it is preferable that a gas containing F such as $SF_6$, $CF_4$, or $CH_xF_y$ is introduced to a FAB source, and the etching is performed using the FAB containing F. When the basic material is a low-k material (low dielectric-constant material), it is preferable that oxygen gas is introduced to the FAB source and the etching is performed using the FAB containing an oxygen component.

The FAB, which is a general term of a particle beam that is neutral and energetic, does not have electric charge, therefore it does not cause charge-up even on an insulator such as $SiO_2$ or low-k material, and can perfectly etch and remove the residue at the bottom of the via-hole.

Figure 3:
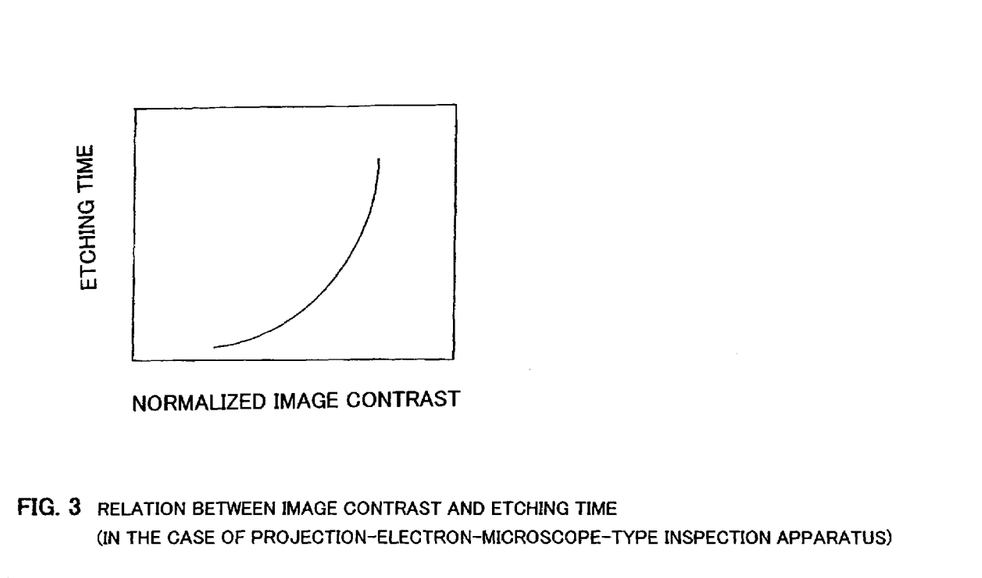
FIG. 3 is a diagram showing an example of a calibration curve of contrast of the inspection image obtained by the projection-electron-microscope-type inspection apparatus to etching time.

As above, since the contrast of the inspection image is in monotonous relation to the amount of etching residue, etching time required for removing the residue can be experimentally obtained. FIG. 3 is a diagram showing an example of a calibration curve of the contrast of the inspection image obtained by the projection-electron-microscope-type inspection apparatus to the etching time. The contrast is normalized using a value at which the contrast is saturated assuming that contrast in the normal via-hole is zero. The data are previously stored in a PC (personal computer) in the shape repairing apparatus, thereby the inspection and the etching of the residue can be automatically performed.

Also, in the SEM-type, it is natural that the relation between the contrast and the etching time can be experimentally obtained similarly as in the projection-electron-microscope-type, therefore the inspection and the etching of the residue can be automated.

Here, since time required for practicing the shape repairing method of the invention is short compared with time required for other steps in a manufacture line of the semiconductor device, the shape repairing method of the invention can be automated and incorporated into the manufacture line, and used in an inline manner without lengthening the tact time in the semiconductor manufacture line.

When the inspection time of the wafer is further reduced, an inspection region of the wafer can be previously limited to only a region where the imperfect via-hole is easily formed (for example, a cell portion near an end of a die at an end of the wafer).

While the etching time of the residue using the FAB is not particularly limited as long as it is within a range that the residue can be removed, since the residue is in at most nanometer order, the etching time is generally in order of several seconds to sixty seconds, and can be preferably made to be 3 sec to 30 sec, and more preferably 1 sec to 10 sec.

As needed, it is acceptable that the wafer is inspected again after the residue is etched so that the absence of the imperfect via-hole is confirmed, and then the wafer is advanced to the next step. When the imperfect via-hole still remains at the second inspection, the FAB etching can be performed again. These may be repeatedly performed.

Figure 4:
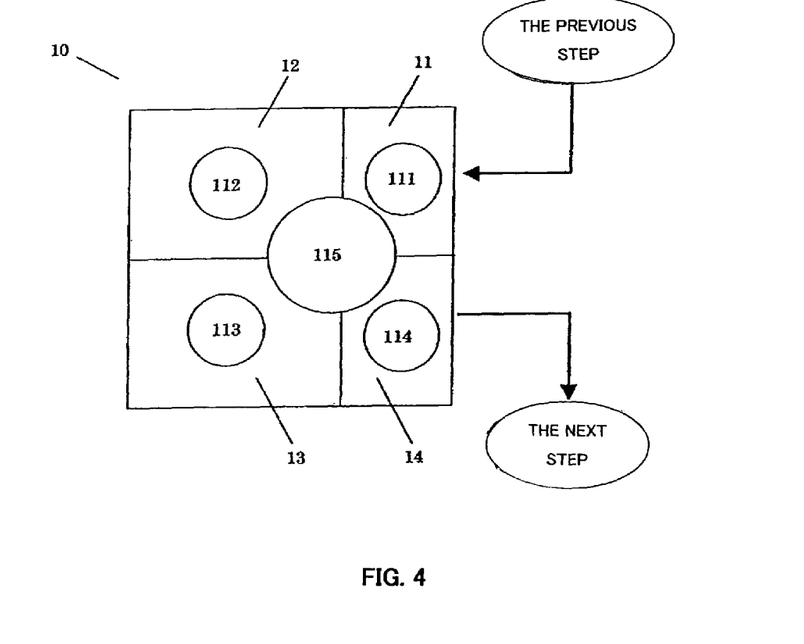
FIG. 4 is a diagram of an example of the shape repairing apparatus of the invention.

FIG. 4 is a diagram showing an example of the shape repairing apparatus of the invention. The shape repairing apparatus 10 comprises a loading room 11, an inspection room 12, an etching room 13, and an unloading room 14. A loading device 111 is arranged in the loading room 11, which has a mechanism for carrying a wafer from the previous step and has an airlock mechanism (both are not shown). A mini-environment room may be provided as needed. A defect inspection device 112 using the electron beam is arranged in the inspection room 12, and a FAB (fast atom beam) etching device 113 is arranged in the etching room 13. An unloading device 114 is arranged in the unloading room 14, which has a mechanism for carrying the treated wafer to the next step and an airlock mechanism (both are not shown). Wafer carrying from each of the devices is performed by a carrier device 115. Each of the rooms 11 to 14 and the carrier deice 115 are partitioned by an isolation valve to prevent cross contamination. The defect inspection device 112 and the FAB etching device 113 configure the defect inspection section and the radiation-ray illustrating section of the shape repairing apparatus of the invention, respectively.

The wafer after a via-hole drilling step as the previous step, for example, a drilling step using reactive ion etching (resist has been already removed) is carried into the loading room 11. Here, a rotational position and a central position are set using a notch or an orientation-flat as reference, and then carried into the inspection room 12 by the carrier device 115. Here, the via-hole in the wafer is inspected. That is, the contrast of the via-hole is measured by the defect inspection device 112, and a via-hole having a predetermined brightness or more or less is detected as the imperfect via-hole having the residue. The defect inspection device 112 has, while not shown, an optical microscopy for positioning at low magnification and preliminary inspection. Although all via-holes in the wafer may be inspected here, only via-holes in particular wafer regions, which have been previously set, for example, via-holes within 2 to 10 regions or 10 to 100 regions may be inspected by the defect inspection device 112. When one imperfect via-hole or more is detected in the inspection, the wafer is carried into the etching room 13 by the carrier device 115. Here, etching is performed by the FAB etching device 113 only for a time period in correspondence with the image contrast of the imperfect via-hole obtained in the inspection. That is, data of the image contrast of the imperfect via-hole measured by the defect inspection device 112 are sent to a not-shown computer, and the computer sees a previously obtained calibration-curve between image contrast and etching time, and determines etching time for the residue. The computer transmits the determined etching time to the FAB etching device 113, and the FAB etching device 113 irradiates the FAB onto the wafer only for the determined time. Generally, the residue can be completely removed at several seconds per one nanometer in thickness of the residue. The wafer after the etching is carried into the unloading room 114 by the carrier device 115, and further transported to the next step, for example a deposition step using CVD (Chemical Vapor Deposition), sputtering, or film forming step such as plating. After etching the residue, it is also better that the wafer is returned to the inspection room 12 for inspection, and the absence of the imperfect via-hole is confirmed, and then the wafer is carried to the next step.

The inspection and the repair of the shape are completed through the above steps.

Regarding diameter of the via-hole repaired in the invention, while it is not particularly limited, in particular, the invention is usefully applied to a via-hole having a diameter of 0.13 µm or less.

Figure 5:
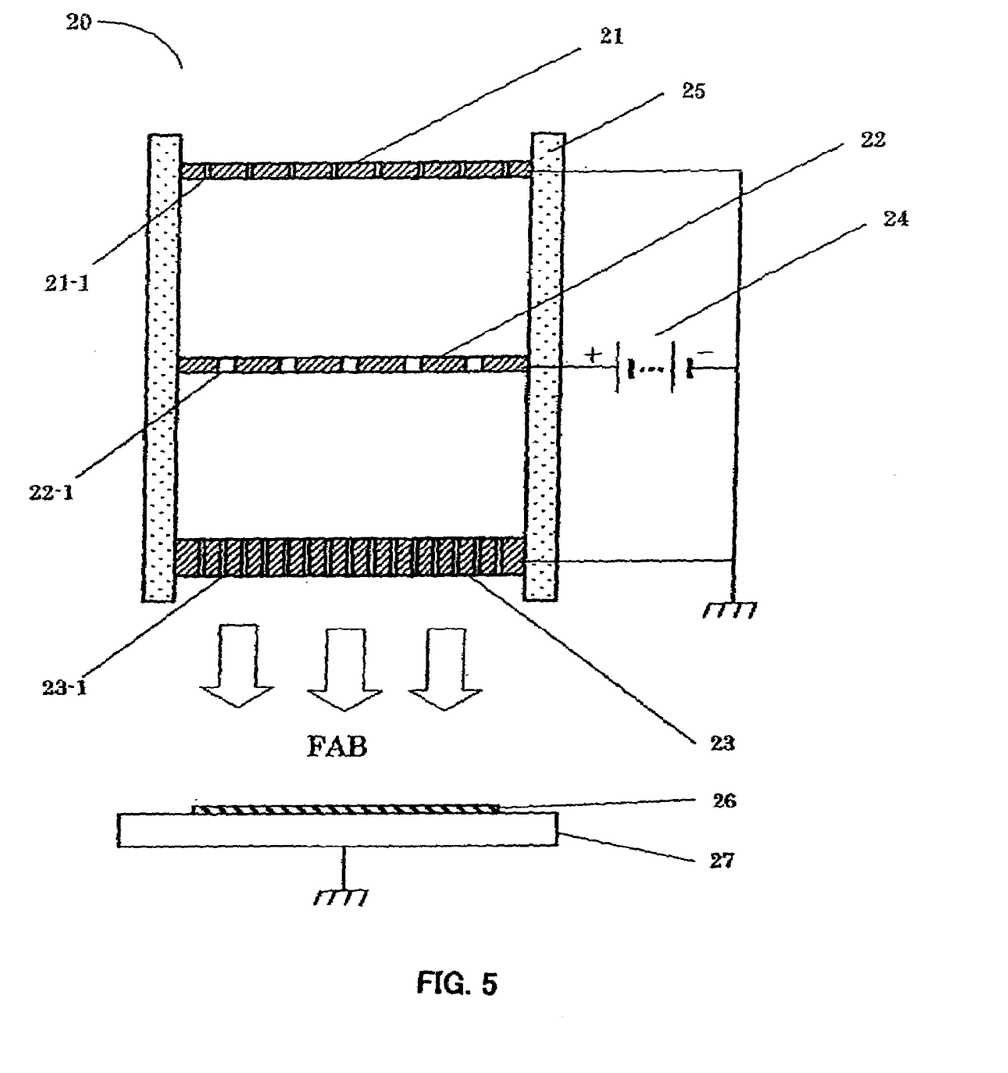
FIG. 5 is a view showing an example of a FAB source used in the invention.

FIG. 5 shows an example of a FAB source used in the FAB etching. In a FAB source 20, three disk-like electrodes are fixed parallel using a cylindrical insulating member 25 as a support, and the electrodes are formed in the order of a gas introduction cathode 21, an anode 22, and a FAB emission electrode 23 from above. Gas introduction holes 21-1 of 2 mm in diameter are opened in the gas introduction cathode 21 with an equal interval, therefore pressure distribution of introduction gas is uniform in the cylindrical member. Accordingly, density of plasma to be generated is uniform, and the emitted FAB is uniformly distributed. Anode holes 22-1 of 5 mm in diameter are opened in the anode 22 with an equal interval. For the holes, any diameter value between one millimeter and a value of inner diameter of the insulating member can be selected. FAB emission holes are opened in the FAB emission electrode 23. The holes are 0.1 mm to 100 mm in diameter, preferably 0.5 mm to 10 mm, and more preferably 1 mm to 3 mm. As a value of length of the holes (corresponding to thickness of the FAB emission electrode 23), 1 mm to 50 mm, preferably 3 mm to 30 mm, and more preferably 10 mm to 20 mm are selected, thereby a FAB having good directivity can be efficiently drawn out from the FAB source.

The FAB source is operated according to the following procedure. The FAB source 20 is arranged in a not-shown vacuum chamber, and a sample stage 27 is arranged along a FAB emission direction. A wafer 26 in which the imperfect via-hole is detected in the inspection is arranged on the sample stage 27. The vacuum chamber is evacuated to about $10^{-4}$ Pa, and then a predetermined gas is introduced into the FAB source through the gas introduction holes 21-1. A member for introducing the gas is omitted from the figure. After the gas is introduced such that a pressure inside of the FAB source becomes at about 1 Pa, the two cathodes 21, 23 are dropped to ground potential, and when high voltage of +2 to +3 kV is applied to the anode 22, discharge occurs. As the discharge occurs, the FAB is emitted through the FAB emission holes 23-1. A not-shown protective-resistor of several kilo-ohms is inserted between a power source and the anode, so that abnormal discharge is prevented. After the discharge is stabilized, a not-shown shutter is opened to irradiate the FAB onto a sample, thereby the residue is etched. As a wafer area irradiated with the FAB at that time, while only a portion having the imperfect via-hole can be selected, an entire surface of the wafer may be simultaneously irradiated. The entire surface of the wafer is simultaneously irradiated, thereby the residue in the via-hole can be removed in a short period of time.

The etching time depends on thickness of the residue, and can be determined from a calibration curve that has been experimentally obtained. For example, in the case of a via-hole which is opened in $SiO_2$ and 1 nm in thickness of the residue, the etching time is several seconds.

Figure 6:
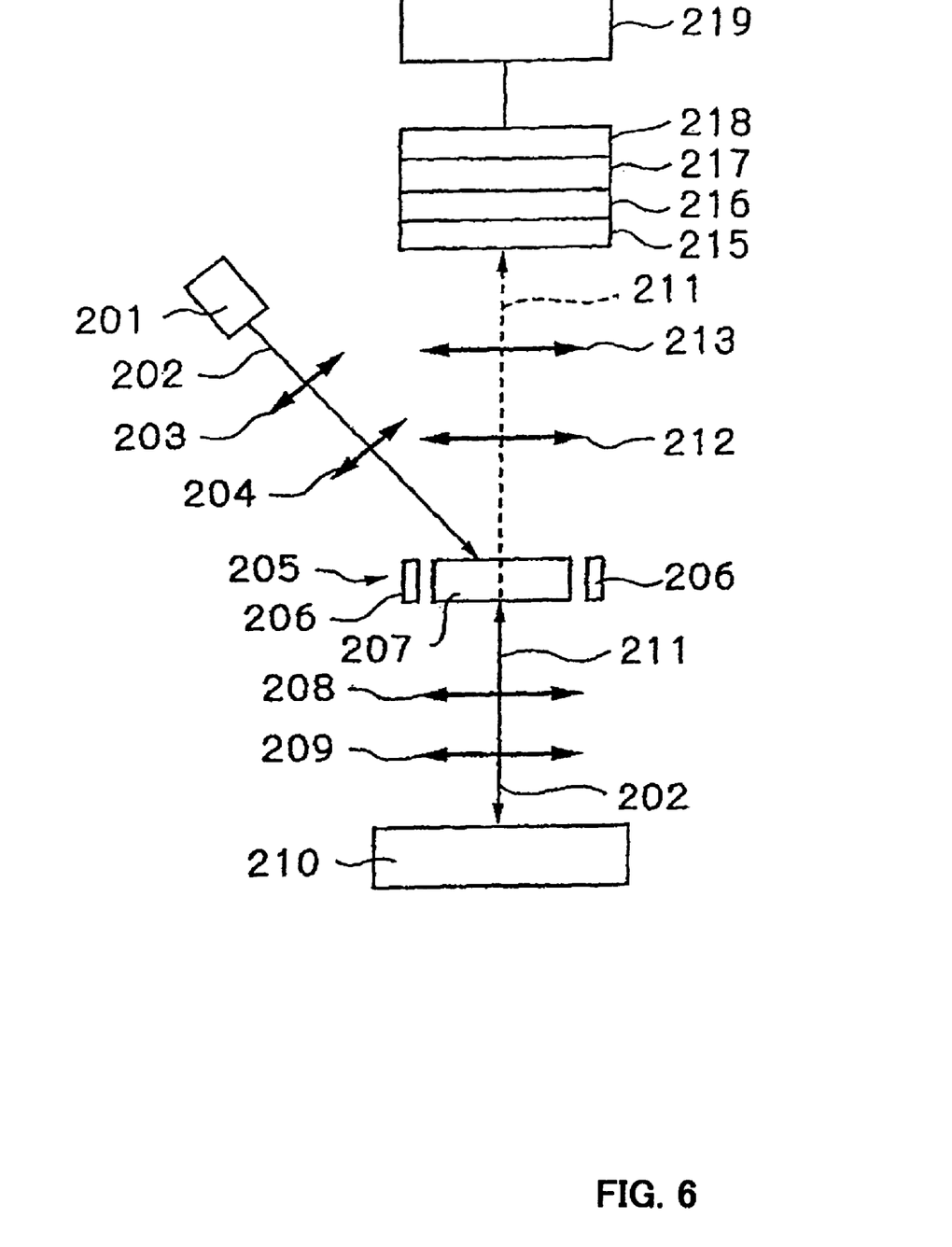
FIG. 6 is a view showing an example of the projection-electron-microscope-type inspection apparatus used in the invention.

FIG. 6 is a view showing an example using the projection-electron-microscope-type electron-beam inspection apparatus as the electron-beam defect inspection apparatus. A primary electron beam emitted from an electron gun 201 is shaped into a circle or a rectangle through an opening (not shown), and an image 0.5 mm by 0.125 mm in square is formed on a deflecting central plane of a ExB filter 205 through two-stage lenses 203, 204. The ExB filter 205, which is also called the Wien filter, has an electrode 206 and a magnet 207, and has a structure where an electric field and a magnetic field are intersected at right angles. The filter 205 has a function of deflecting the primary electron beam 202 to 35 degrees and directing it in a sample direction (direction perpendicular to the sample), on the other hand, it has a function of straightly advancing a secondary electron beam from the sample. The primary electron beam 202 deflected by the ExB filter 205 is reduced to ⅔ by lenses 208, 209, and projected onto the sample 210. Secondary electrons 211 having data of a pattern image, which are emitted from the sample 210, are magnified by the lenses 209, 208, and then advance straightly through the ExB filter 205, and then magnified by the lenses 212, 213, and then sensitized to ten thousand times by a MCP (multichannel plate) 215, and then converted to light by a fluorescent section 216, and then formed into electric signals in synchronization with scanning speed on the sample by a TDI-CCD 218 through a relay optical-system 217, and then obtained as continuous images at an image display 219. Furthermore, the images are compared to a plural number of cell images and a plural number of die images on time, thereby defects on a surface of the sample (for example, wafer) are detected. Furthermore, a feature such as shape, a position coordinate, and the number of the detected defects are recorded and output on a CRT. On the other hand, an appropriate condition for a sample substrate is selected for each of different surface structures of the sample substrate, such as oxide film or nitride film, or selected for each of different steps, and the electron beam is irradiated according to the condition, and after the irradiation is performed at the optimum irradiation condition, an image by the electron beam is obtained and the defects are detected.

Next, a method for manufacturing the semiconductor device of the invention is described.

Figure 7:
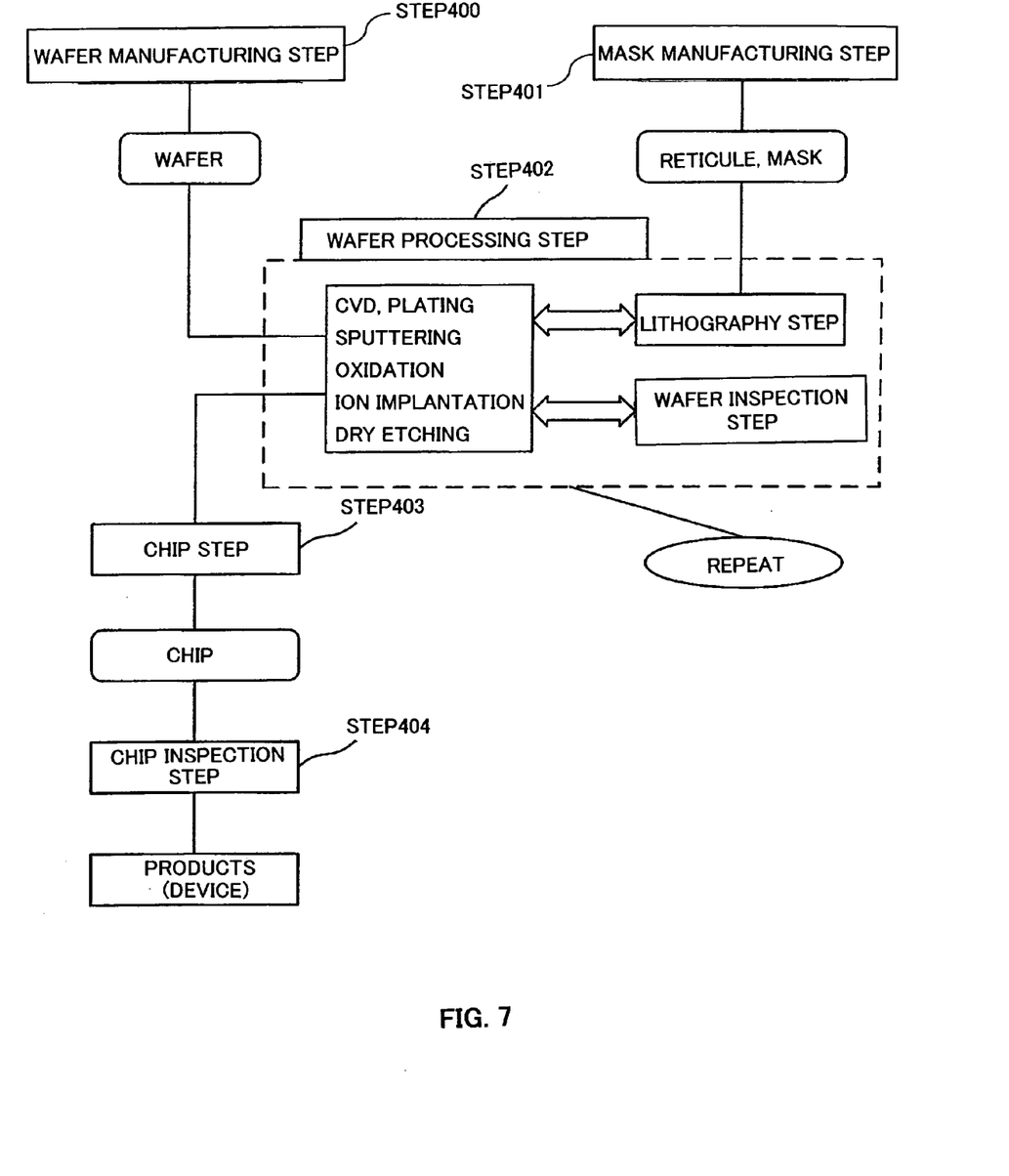
FIG. 7 is a flowchart showing an example of the method for manufacturing a semiconductor device of the invention.

FIG. 7 is a flowchart showing an example of the method for manufacturing the semiconductor device of the invention. The manufacturing process in the example includes respective main steps as follows:

(1) a wafer manufacturing step 400 for manufacturing the wafer (or wafer preparation step for preparing the wafer);

(2) a mask manufacturing step 401 for manufacturing a mask used for exposure (or mask preparation step for preparing the mask);

(3) a wafer processing step 402 for performing processing necessary for the wafer;

(4) a chip assembling step 403 for cutting out chips formed on the wafer one by one to make the chips active;

and (5) a chip inspection step 404 for inspecting a produced chip.

Each of the steps further comprises several sub-steps.

Among the main steps, a particular main-step that affects definitely on performance of the semiconductor device is the wafer processing step 402. In the step, designed circuit patterns are sequentially stacked on the wafer, thereby many chips that act as memory or MPU are formed. The wafer processing step 402 includes respective steps as follows:

(1) a thin-film forming step for forming a dielectric film as an insulating layer, or forming a metal thin-film forming a wiring portion or an electrode portion (using CVD, sputtering, and plating);

(2) an oxidation step for oxidizing the thin-film layers or the wafer substrate;

(3) a lithography step for forming a resist pattern using a mask (reticule) for selectively processing the thin-film layers or the wafer substrate;

(4) an etching step for processing the thin-film layers or the substrate according to the resist pattern (for example, using a dry etching technique);

(5) a step for injecting and diffusing ions/impurities;

(6) a step for separating the resist;

and (7) an inspection step for further inspecting the processed wafer.

The wafer processing step is repeatedly performed only by the number of necessary layers, thereby a semiconductor device that acts exactly as designed is manufactured.

The shape repairing method or the shape repairing apparatus of the via-hole of the invention can be mainly used after the fourth etching step. That is, a step for repairing the shape of the via-hole using the shape repairing method or the shape repairing apparatus of the via-hole of the invention is introduced subsequent to the etching step (4), thereby the method for manufacturing the semiconductor device of the invention can be provided. Accordingly, the etching residue produced in the fourth etching step is removed, and the shape of the imperfect via-hole can be repaired.

Moreover, since the time period required for the step for repairing the shape of the via-hole using the shape repairing method or the shape repairing apparatus of the invention is short compared with the time period required for other steps in the manufacture line of the semiconductor device, the method for manufacturing the semiconductor device of the invention can be provided without lengthening the tact time in the semiconductor manufacturing line, which includes the step for repairing the shape of the via-hole using the shape repairing method or repairing apparatus of the invention. That is, the tact time in manufacturing the semiconductor device including the step for repairing the shape of the via-hole can be made equal to tact time in the case without including the step.

Figure 8:
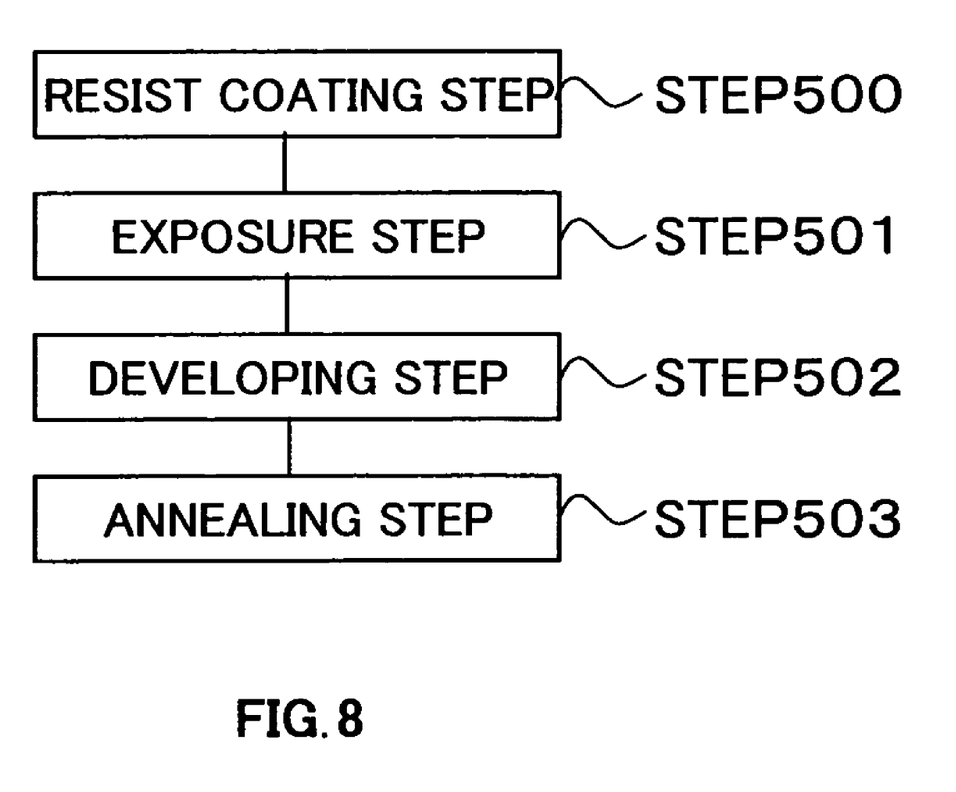
FIG. 8 is a flowchart showing a lithography step.

FIG. 8 is a flowchart showing a lithography step that is the core of the wafer processing step 402 in FIG. 7. The lithography step includes the following steps:

(1) a resist coating step 500 for coating resist on the wafer on which the circuit patterns are formed in the previous step;

(2) an exposure step 501 for exposing the resist;

(3) a developing step 502 for developing the exposed resist to obtain the resist pattern;

and (4) an annealing step 503 for stabilizing the developed resist pattern.

The semiconductor-device manufacturing process, wafer processing process, and lithography process are publicly known, and further description will not be required.

What is claimed is:

1. A method for repairing a pattern shape of a substrate having an imperfect pattern, including,
   (a) a step for inspecting the substrate and thus detecting the imperfect pattern, and
   (b) a step for repairing the pattern shape by performing etching to the detected imperfect-pattern using radiation rays, wherein irradiation time length of the radiation rays is varied relative to image contrast of the imperfect patterns obtained in the inspection.

2. The shape repairing method according to claim 1, further including at least one step for inspecting the substrate again and thus confirming absence of the imperfect pattern.

3. The shape repairing method according to claim 1, wherein the etching is performed by irradiating the radiation rays simultaneously on an entire surface of the substrate.

4. The shape repairing method according to claim 1, wherein the inspection is inspection using an electron beam.

5. The shape repairing method according to claim 4, wherein the inspection using the electron beam is inspection using projection-electron-microscope-type electron-beam apparatus or scanning-type electron-beam apparatus.

6. The shape repairing method according to claim 1, wherein only a previously-set-region in which the imperfect pattern is easy to occur is inspected in the inspection.

7. The shape repairing method according to claim 1, wherein the pattern is metal wiring, a via-hole, or a via-plug.

8. The shape repairing method according to claim 1, wherein the substrate is a wafer.

9. The shape repairing method according to claim 1, wherein the radiation rays are a fast atom beam.

10. A method for manufacturing a semiconductor device, including a step for repairing a pattern shape using the shape repairing method according to claims 1.

11. The manufacturing method according to claim 10, wherein tact time in manufacturing the semiconductor device including the step for repairing the pattern shape is equal to tact time in a case without including the step.

* * * * *